United States Patent
Lin et al.

(10) Patent No.: US 9,825,200 B2
(45) Date of Patent: Nov. 21, 2017

(54) MICRO-LIGHT-EMITTING DIODE DEVICE AND METHOD FOR MANUFACTURING THE SAME

(71) Applicant: AU Optronics Corporation, Hsin-Chu (TW)

(72) Inventors: Tsung-Yi Lin, Hsin-Chu (TW); Cheng-Chieh Chang, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 15/060,885

(22) Filed: Mar. 4, 2016

(65) Prior Publication Data

US 2016/0336486 A1 Nov. 17, 2016

(30) Foreign Application Priority Data

May 13, 2015 (TW) .............................. 104115267 A

(51) Int. Cl.
*H01L 33/24* (2010.01)
*H01L 33/00* (2010.01)
*H01L 33/20* (2010.01)
*H01L 33/22* (2010.01)

(52) U.S. Cl.
CPC ............ H01L 33/005 (2013.01); H01L 33/20 (2013.01); H01L 33/22 (2013.01)

(58) Field of Classification Search
CPC .......... H01L 33/05; H01L 33/24; H01L 33/36
USPC ...................... 257/82, 88, 98; 438/22, 24, 46
See application file for complete search history.

(56) References Cited

U.S. PATENT DOCUMENTS

| 6,410,940 B1* | 6/2002 | Jiang ..................... B82Y 20/00 257/79 |
| 6,410,942 B1* | 6/2002 | Thibeault ................ H01L 33/08 257/88 |
| 2003/0222263 A1 | 12/2003 | Choi |
| 2006/0113638 A1 | 6/2006 | Maaskant et al. |
| 2007/0018187 A1* | 1/2007 | Lee ......................... H01L 33/22 257/98 |

FOREIGN PATENT DOCUMENTS

| TW | 521446 | 2/2003 |
| TW | 200832746 | 8/2008 |
| TW | 200832747 | 8/2008 |

* cited by examiner

*Primary Examiner* — Marc Armand
*Assistant Examiner* — Warren H Kilpatrick
(74) *Attorney, Agent, or Firm* — WPAT, PC

(57) ABSTRACT

A micro-light-emitting diode (micro-LED) device includes a first semiconductor layer, an active layer, and a second semiconductor layer. The first semiconductor layer includes a first bottom surface. The active layer is disposed on the first semiconductor layer. The second semiconductor layer disposed on the active layer includes a second bottom surface. A surface of the second semiconductor layer opposite to the active layer is a light-exiting surface of the micro-LED device. The second semiconductor layer has different thicknesses, in which a minimum thickness of the second semiconductor layer is located at an edge or at least one side of the second semiconductor layer. Vertical-projection zones of the first semiconductor layer, the active layer, and the second semiconductor layer on the first bottom surface are substantially the same.

4 Claims, 15 Drawing Sheets

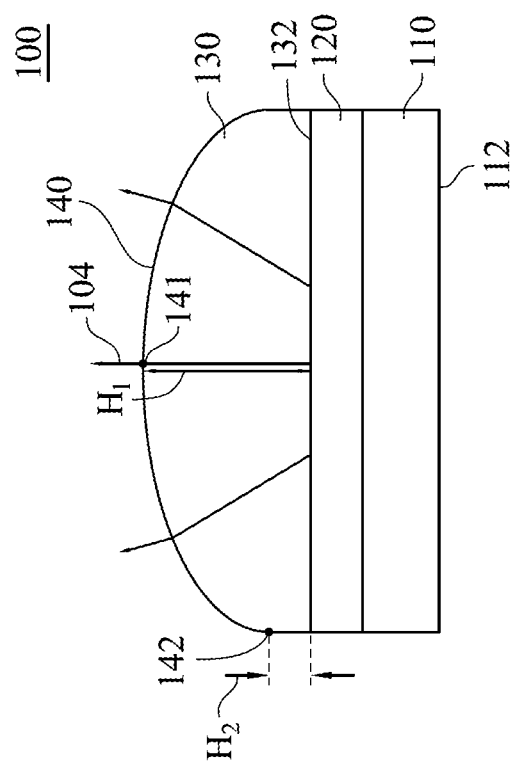
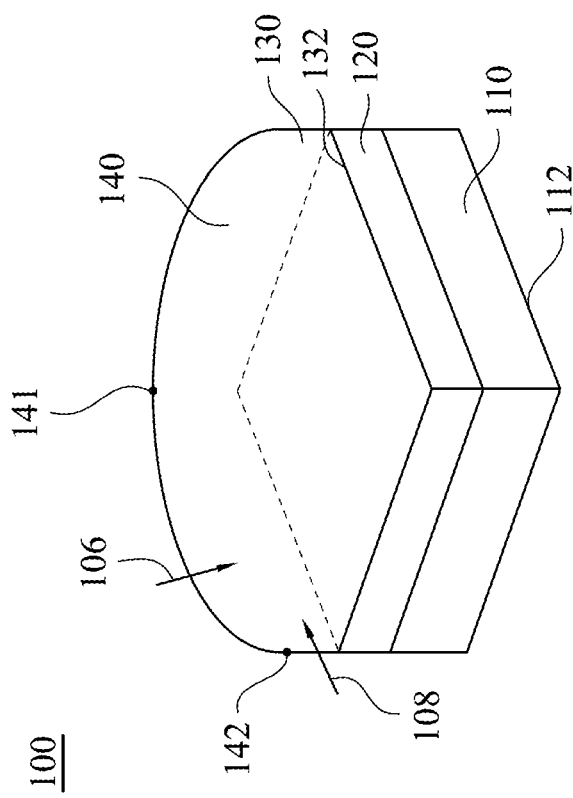
Fig. 1A
Fig. 1B

S10

S20

S30

S40

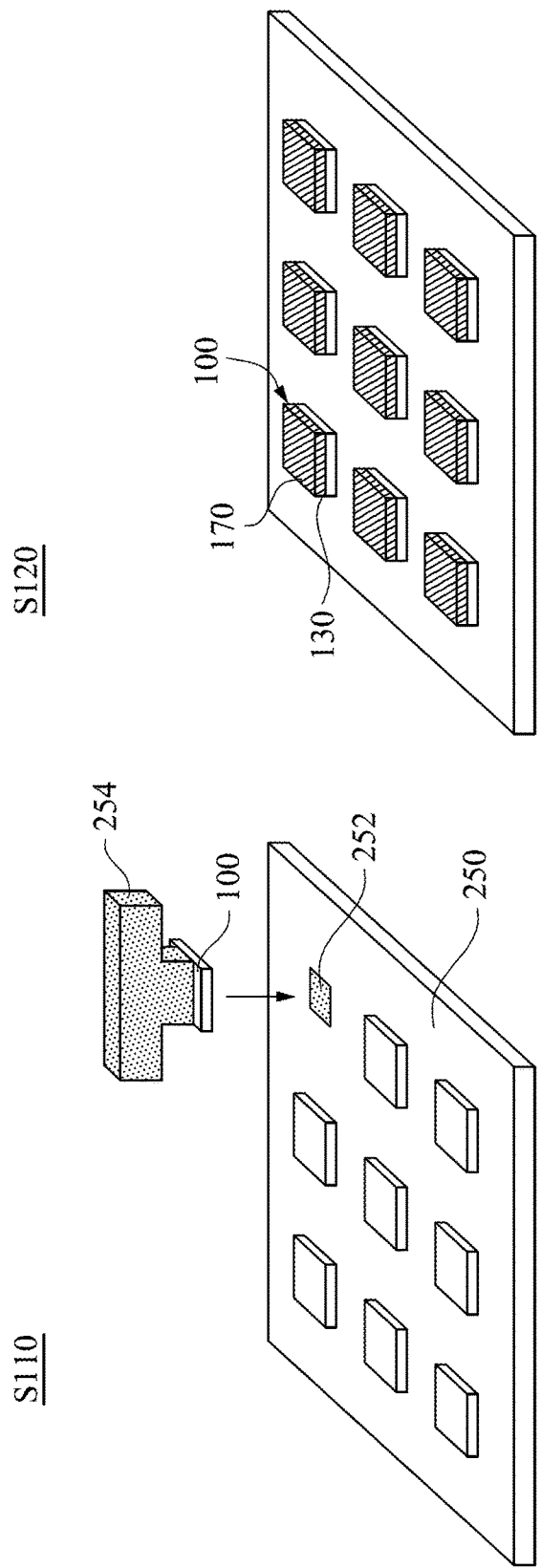

MICRO-LIGHT-EMITTING DIODE DEVICE AND METHOD FOR MANUFACTURING THE SAME

RELATED APPLICATIONS

This non-provisional application claims priority under 35 U.S.C. §119(a) on Patent Application No(s). 104115267 filed in Taiwan, R.O.C. on May 13, 2015, the entire contents of which are hereby incorporated by reference.

BACKGROUND

Field of Disclosure

The present disclosure relates to a micro-light-emitting diode device and a method for manufacturing the same.

Background of the Disclosure

With the progress of science and technology, light-emitting diodes have already become common devices that are widely applied to commercial usages. As a light source, light-emitting diodes have plenty of advantages, which comprise low energy consumption, long service time, and fast switching. As a result, traditional light sources have gradually been replaced by the light-emitting diode light sources.

Apart from serving as a light source, light-emitting diode technology has been developed in the display field. For example, the micro-light-emitting diode display technology in which micro-light-emitting diodes (micro-LEDs) are formed to serve as pixels has been developed in recent years.

However, as compared with a prior art light-emitting diode, a micro-light-emitting diode has a smaller light-emitting area. Since the micro-light-emitting diode has a smaller light-emitting area, it contributes to the inadequate light extraction efficiency of the micro-light-emitting diode. In other words, micro-light-emitting diodes have the problem of insufficient brightness.

SUMMARY

In one aspect of the present disclosure, a micro-light-emitting diode device is provided. In certain embodiments, the micro-light-emitting diode device includes a first semiconductor layer, an active layer, and a second semiconductor layer. The first semiconductor layer has a first bottom surface. The active layer is disposed on the first semiconductor layer. The second semiconductor layer has a second bottom surface. The second semiconductor layer is disposed on the active layer. A surface of the second semiconductor layer opposite to the active layer is a light-exiting surface of the micro-light-emitting diode device. The second semiconductor layer has multiple thicknesses. A minimum thickness of the second semiconductor layer is located at an edge or at least one side of the second semiconductor layer. Vertical-projection zones of the first semiconductor layer, the active layer, and the second semiconductor layer on the first bottom surface are substantially the same.

In some embodiments, the light-exiting surface of the second semiconductor layer has a first apex and a first end point. A vertical distance between the first apex and the second bottom surface is a maximum among the thicknesses of the second semiconductor layer. A vertical distance between the first end point and the second bottom surface is a minimum among the thicknesses of the second semiconductor layer.

In some embodiments, a vertical distance between the light-exiting surface of the second semiconductor layer and the second bottom surface gradually decreases from the first apex to the first end point.

In some embodiments, the light-exiting surface of the second semiconductor layer is in a spherical shape, in an inverted-T shape, or in a pointed shape.

In some embodiments, the light-exiting surface of the second semiconductor layer has at least one microstructure. The microstructure includes a plurality of recessed portions or a plurality of raised portions.

In some embodiments, a shape of the first bottom surface of the first semiconductor layer is a circle or a polygon, and the shape and a size of the first bottom surface are substantially the same as a shape and a size of the second bottom surface.

In some embodiments, the vertical distance between the first apex and the second bottom surface is more than 0 micrometer and less than or equal to 20 micrometers.

In some embodiments, the vertical distance between the first end point and the second bottom surface is more than 0 micrometer and less than or equal to 10 micrometers.

In some embodiments, a difference between the vertical distance between the first apex and the second bottom surface and the vertical distance between the first end point and the second bottom surface is more than 0 micrometer and less than or equal to 10 micrometers.

In some embodiments, the second semiconductor layer has a first thickness corresponding to a first area. The second semiconductor layer has a second thickness corresponding to a second area. The first thickness is greater than the second thickness such that the second semiconductor layer has at least one step between the first area and the second area.

In some embodiments, an area corresponding to the first thickness of the second semiconductor layer occupies 65% to 85% of a total area of the light-exiting surface.

In some embodiments, the second area surrounds the first area.

In the foregoing, the micro-light-emitting diode device further includes an electrode layer disposed on the second semiconductor layer.

In another aspect of the present disclosure, a method for manufacturing a micro-light-emitting diode device is provided. In certain embodiments, the method includes the following steps. A first substrate is provided. A mask layer is deposited on the first substrate. The mask layer is patterned to expose a portion of the first substrate. The exposed portion of the first substrate is etched to form a recess, in which a depth at a center of the recess is greater than a depth at an edge of the recess. The mask layer is removed. A second semiconductor layer is deposited on the recess. An active layer and a first semiconductor layer are deposited in sequence, in which the active layer is deposited on the second semiconductor layer, and the first semiconductor layer is deposited on the active layer to form at least one micro-light-emitting diode device on the first substrate. The first substrate and the micro-light-emitting diode device are transferred to a second substrate, in which the first semiconductor layer of the micro-light-emitting diode device is connected to the second substrate. The first substrate is removed.

In some embodiments, the second semiconductor layer is deposited in the recess and fills and levels up the recess.

In some embodiments, the portion of the first substrate is etched to form a first shape, and the second semiconductor layer is deposited on the recess to form a light-exiting surface. The light-exiting surface has a second shape. The first shape and the second shape are the same.

In some embodiments, the method further includes the following steps. A panel is provided, and at least one thin film transistor is formed on the panel. The micro-light-emitting diode device is gripped to allow the micro-light-emitting diode device to be separated from the second substrate, and the micro-light-emitting diode device is moved onto the thin film transistor. An electrode layer is formed on the second semiconductor layer of the micro-light-emitting diode device.

In summary, an embodiment of the present disclosure provides a micro-light-emitting diode device. The micro-light-emitting diode device includes the second semiconductor layer. A surface of the second semiconductor layer is the light-exiting surface, and the second semiconductor layer has a greater thickness at the center than at the edge. Therefore, the cross section of the light-exiting surface has a more protruding center. As a result, the probability of the reflected light inside of the micro-light-emitting diode device by can be effectively reduced.

BRIEF DESCRIPTION OF THE DRAWINGS

FIG. 1A and FIG. 1B respectively depict a three-dimensional schematic diagram and a cross-sectional view of a micro-light-emitting diode device according to a first embodiment of this disclosure;

FIG. 10A to FIG. 10L depict schematic diagrams of a method for manufacturing a micro-light-emitting diode device respectively at different steps according to a first embodiment of this disclosure;

DESCRIPTION OF THE EMBODIMENTS

Figure 2:
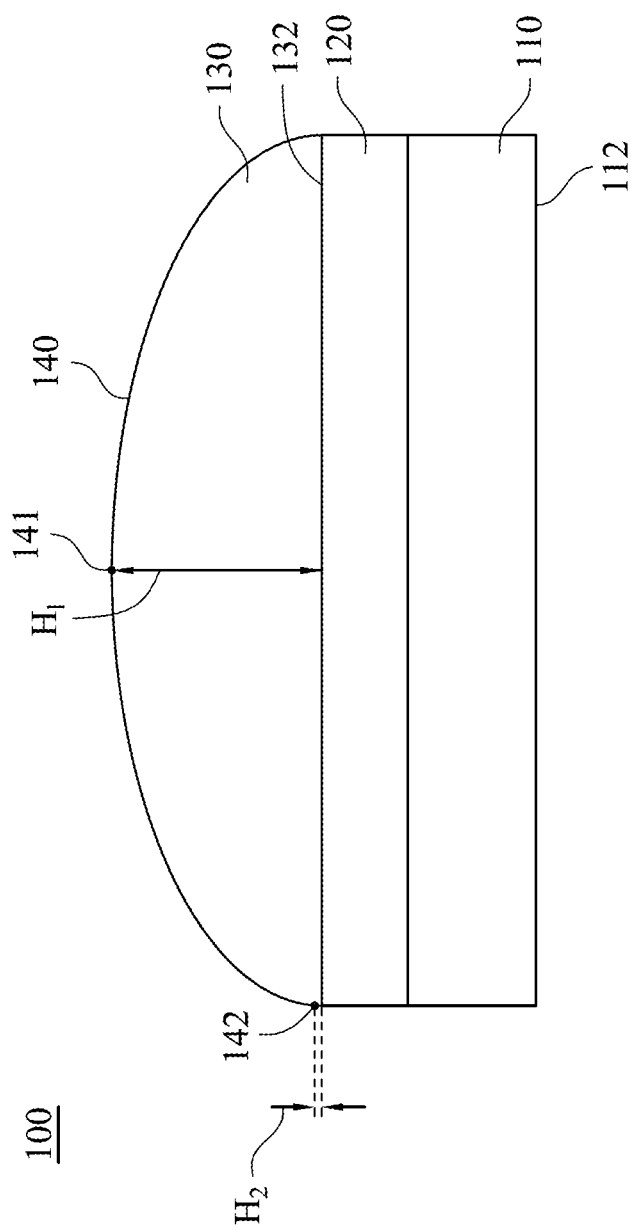
FIG. 2 depicts a cross-sectional view of a micro-light-emitting diode device according to a second embodiment of this disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that, although the terms "first", "second", etc. may be used herein to describe various elements, components, regions, layers and/or sections. These elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

In the drawing figures, the dimensions of layers and regions may be exaggerated for clarity of illustration. Like reference numerals refer to like elements throughout. The same reference numbers indicate the same components throughout the specification.

Spatially relative terms, such as "beneath," "below," "lower," "above," "upper" and the like, may be used herein for ease of description to describe one element or feature's relationship to another element (s) or feature (s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Since micro-light-emitting diode devices are characterized by a small size, they have more and wider ranges of applications, such as being suitable to be used as pixels of a display, wherein the small size is micrometers scale size. However, the small size that the micro-light-emitting diode devices have decreases the light-emitting area, which in turn causes the problem of insufficient light emission. In view of this, the second semiconductor layer of the micro-light-emitting diode device of the present disclosure has multiple thicknesses, in which the thickness at a center area is greater than edge area, and the center area is surrounded by the edge area.

The minimum thicknesses of the micro-light-emitting diode device is located at an edge or at least one side. The cross section of the light-exiting surface thus has a more protruding center. Therefore, the probability that the light is totally reflected inside the micro-light-emitting diode device is reduced to increase the light extraction efficiency of the micro-light-emitting diode.

FIG. 1A and FIG. 1B respectively depict a three-dimensional schematic diagram and a cross-section view of a micro-light-emitting diode device 100 according to a first embodiment of this disclosure. The micro-light-emitting diode device 100 includes a first semiconductor layer 110, an active layer 120, and a second semiconductor layer 130. The first semiconductor layer 110 has a first bottom surface 112. The active layer 120 is disposed on the first semiconductor layer 110. The second semiconductor layer 130 is disposed on the active layer 120 and has a second bottom surface 132. A surface of the second semiconductor layer 130 opposite to the active layer 120 is a light-exiting surface 140 of the micro-light-emitting diode device 100. Wherein light 104 emitted from the active layer to the light-exiting surface 140. The second semiconductor layer 130 has multiple thicknesses. The thickness refers to a vertical distance between the second bottom surface 132 and the light-exiting surface (the surface of the second semiconductor layer) 140. For example, a first thickness H1 is the thickness at a center 141 of the second semiconductor layer 130, and a second thickness H2 is the thickness at an edge (for example end point 142) of the second semiconductor layer 130. A minimum thickness of the second semiconductor layer 130 is located at the edge. Vertical-projection zones of the first semiconductor layer 110, the active layer 120, and the second semiconductor layer 130 on the first bottom surface 112 are substantially the same.

In FIG. 1A and FIG. 1B, the micro-light-emitting diode device 100 uses a top surface of the second semiconductor layer 130 as the light-exiting surface 140. The second bottom surface 132 of the second semiconductor layer 130 is a flat surface. That is, a top surface of the active layer 120 is a flat surface. According to the present embodiment, the second semiconductor layer 130 has a spherical light-exiting surface 140. The light-exiting surface 140 has a first apex 141 and a first end point 142. A vertical distance between the first apex 141 and the second bottom surface 132 is a maximum among the thicknesses of the second semiconductor layer 130. A vertical distance between the first end point 142 and the second bottom surface 132 is a minimum among the thicknesses of the second semiconductor layer 130. In other words, a position of the first apex 141 of the light-exiting surface 140 (or a substantial center) is located at a highest point of the light-exiting surface 140, and a tangent of which is parallel with the second bottom surface 132. In addition, the second semiconductor layer 130 depicted in FIG. 1A and FIG. 1B can be regarded as a combination of a pillar (here, the shape of the pillar may be cylindrical or polygonal) and part of a sphere. The pillar is indicated by an arrow 108. The part of the sphere is indicated by an arrow 106.

Since a previous micro-light-emitting diode device has a flat light-exiting surface, parts of light emitted from the active layer to the light-exiting surface will be trap lights in the inside of the second semiconductor layer 130. In the present embodiment, by designing a shape of the light-exiting surface 140 that can improve light extraction effective and reduce light trap in the second semiconductor layer 130. Hence, a probability that the light 104 emitted from the active layer 120 is totally reflected off the light-exiting surface 140 is reduced to increase a light extraction efficiency of the micro-light-emitting diode device 100. Additionally, the spherical light-exiting surface 140 also increases a light-exiting surface area of the micro-light-emitting diode device 100 to improve overall brightness of the micro-light-emitting diode device 100. In addition to that, since the light-exiting surface 140 is a surface (top surface) of the second semiconductor layer, there is no necessity to dispose an additional lens to realize such a configuration.

According to the present embodiment, not only does the spherical light-exiting surface 140 effectively reduce the probability that the light 104 is trap inside the micro-light-emitting diode device 100, but the spherical light-exiting surface 140 also provides a focusing effect for the light 104. That is, the spherical light-exiting surface 140 provides the light 104 with a better directivity. Brightness of the micro-light-emitting diode device 100 is thus improved relatively.

In the present embodiment, P-N heterojunctions in the micro-light-emitting diode device 100 include a junction between the active layer 120 and the first semiconductor layer 110 and a junction between the active layer 120 and a second semiconductor layer 130. The P-N heterojunctions can be regarded as light-emitting areas of the micro-light-emitting diode device 100. Since a size of the vertical-projection zones of the first semiconductor layer 110, the active layer 120, and the second semiconductor layer 130 on the first bottom surface 112 are substantially the same, a length and a width of the P-N heterojunctions in the micro-light-emitting diode device 100 are approximately the same as a length and a width of the first bottom surface 112. In other words, the micro-light-emitting diode device 100 according to the present embodiment can reduce the probability of total reflection without changing a size of the P-N heterojunctions. In greater detail, the light-emitting areas of the micro light-emitting diode device 100 will not be reduced, that is, a light extraction amount of the PN heterojunctions is not affected.

The thickness of the second semiconductor layer 130 gradually decreases from the first apex 141 (or the substantial center) to the first end point 142 of the light-exiting surface 140. The vertical distance between the first apex 141 and the second bottom surface 132 of the second semiconductor layer 130 is the first thickness $H_1$. The vertical distance between the first end point 142 and the second bottom surface 132 of the second semiconductor layer 130 is the second thickness $H_2$. As mentioned previously, the first thickness $H_1$ is the maximum among the thicknesses of the second semiconductor layer 130. The second thickness $H_2$ is the minimum among the thicknesses of the second semiconductor layer 130. With such a thickness relationship in the configuration, the first thickness $H_1$ is more than 0 micrometer (μm) and less than or equal to 20 micrometers, and the second thickness $H_2$ is more than 0 micrometer and less than or equal to 10 micrometers. Additionally, although the second semiconductor layer 130 according to the present embodiment combining the pillar and the part of the sphere serves as an example for illustration, the micro-light-emitting diode device 100 of the present disclosure is not limited in this regard.

In the present embodiment, a size of the micro-light-emitting diode device 100 is between 25 square micrometers (μm²) and 10000 square micrometers. A side length limitation of the micro-light-emitting diode device 100 is less than 100 micrometers (μm). In practices, the micro-light-emitting diode device 100 is used as a pixel of a display panel. The size of the micro-light-emitting diode device 100 according to the predetermined size of the pixel of the display panel may be any suitable adjustment.

According to the present embodiment, for example the first semiconductor layer 110 is a P-type semiconductor. The second semiconductor layer 130 is an N-type semiconductor. A thickness of the P-type semiconductor is more than 0.1 micrometers and less than or equal to 1 micrometer (μm). A thickness of the N-type semiconductor is more than 0.1 micrometers (μm) and less than or equal to 20 micrometers (μm). A thickness of the active layer 120 is between 0.5 nanometers (nm) and 50 nanometers (nm).

In addition, materials of the P-type semiconductor and the N-type semiconductor are varied with color light provided by the micro-light-emitting diode device 100. For example, when the micro-light-emitting diode device 100 is designed to provide red light, the P-type semiconductor and the N-type semiconductor may be gallium arsenide (GaAs) or other suitable materials. When the micro-light-emitting diode device 100 is designed to provide blue light or green light, the P-type semiconductor and the N-type semiconductor may be gallium nitride (GaN), zinc selenide (ZnSe), or aluminum nitride (AlN), or other suitable materials. A material of the active layer 120 may be gallium nitride or indium gallium nitride (InGaN), or other suitable materials.

However, it should be understood that the above-mentioned types of semiconductor layers are for illustrative purposes only and are not intended to limit the present invention. Those of ordinary skill in the art may flexibly select types of the first semiconductor layer 110 and the second semiconductor layer 130 depending on practical needs. In addition, those of ordinary skill in the art may additionally dispose a P⁺-type semiconductor layer or an N⁺-type semiconductor layer to improve the ohmic contact(s) when the micro-light-emitting diode device 100 is connected to electrodes.

In addition to that, a shape and a size of the first bottom surface 112 of the first semiconductor layer 110 are substantially the same as a shape and a size of the second bottom surface 132 of the second semiconductor layer 130. As mentioned previously, since a size of vertical-projection zones of the first semiconductor layer 110, the active layer 120, and the second semiconductor layer 130 on the first bottom surface 112 are substantially the same, a shape of the micro-light-emitting diode device 100 as viewed from the top is the same as that as viewed from the first bottom surface 112 of the first semiconductor layer 110.

FIG. 2 depicts a cross-section view of the micro-light-emitting diode device 100 according to a second embodiment of this disclosure. The difference between the present embodiment and the first embodiment is that a shape of the second semiconductor layer 130 according to the first embodiment is formed by stacking the pillar (here, the shape of the pillar may be cylindrical or polygonal) and the part of the sphere (see FIG. 1A), whereas the shape of the second semiconductor layer 130 according to the present embodiment is formed by removing the cylinder but retaining the part of the sphere.

According to the present embodiment, the second semiconductor layer 130 has the first thickness $H_1$ and the second thickness $H_2$. The first thickness $H_1$ is the vertical distance between the center of the light-exiting surface 140 and the second bottom surface 132, and the first thickness $H_1$ is the maximum among the thicknesses of the second semiconductor layer 130. The second thickness $H_2$ is the thickness of the second semiconductor layer 130 corresponding to an edge of the light-exiting surface 140. That is, the second thickness $H_2$ is the minimum among the thicknesses of the second semiconductor layer 130, and the second thickness is approximately 0. In other words, a length of the second thickness $H_2$ and a position of the first end point 142 marked in FIG. 2 are only schematic, and their length and position are corresponding to the minimum thickness of the second semiconductor layer 130.

In addition to that, since the thicknesses and materials of the first semiconductor layer 110, the active layer 120, and the second semiconductor layer 130 according to the present embodiment are the same as those according to the first embodiment, a description in this regard is not provided.

Figure 3B:
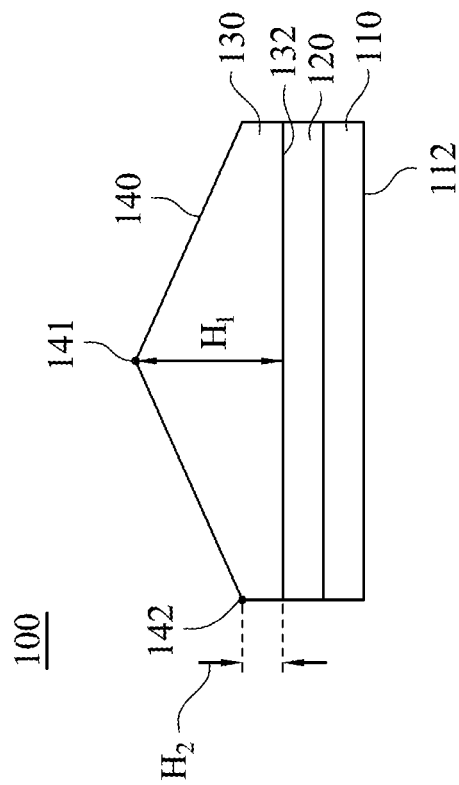
FIG. 3A and FIG. 3B respectively depict a three-dimensional schematic diagram and a cross-section view of a micro-light-emitting diode device according to a third embodiment of this disclosure.
Figure 3A:
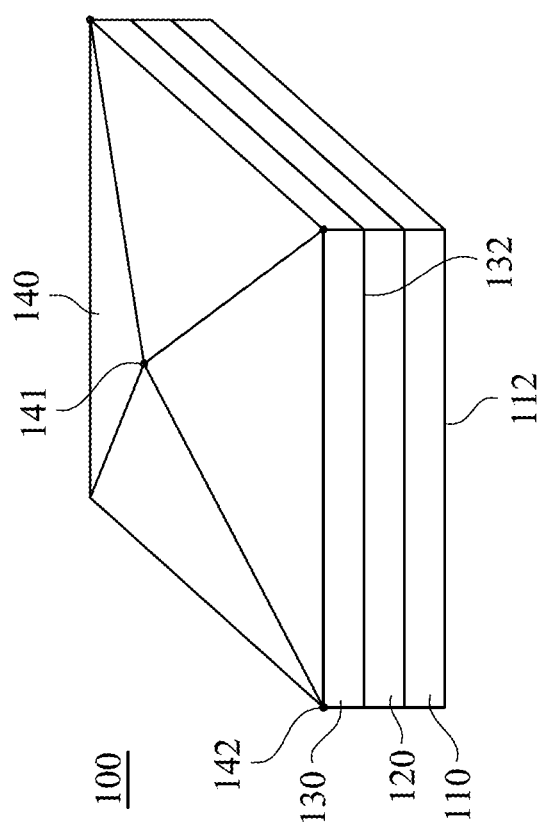

FIG. 3A and FIG. 3B respectively depict a three-dimensional schematic diagram and a cross-section view of the micro-light-emitting diode device 100 according to a third embodiment of this disclosure. The difference between the present embodiment and the first embodiment is that the second semiconductor layer 130 according to the present embodiment is in a pyramidal shape. A shape of the second semiconductor layer 130 is a pentagon when viewed from a side. The center of the light-exiting surface 140 is located at an apex of the pyramidal second semiconductor layer 130, and the edge of the light-exiting surface 140 is aligned with a side of the micro-light-emitting diode device 100. In the present embodiment, the apex of the second semiconductor layer 130 is the first apex 141. A corner at the edge of the light-exiting surface 140 is regarded as the first end point 142. The first apex 141 may be the center or off the center of the light-exiting surface 140, but the present invention is not limited in this regard.

The second semiconductor layer 130 has the first thickness $H_1$ and the second thickness $H_2$. Similarly, the first thickness $H_1$ is the vertical distance between the first apex 141 and the second bottom surface 132, and the first thickness $H_1$ is the maximum among the thicknesses of the second semiconductor layer 130. The second thickness $H_2$ is the vertical distance between the first end point 142 and the second bottom surface 132, and the second thickness $H_2$ is the minimum among the thicknesses of the second semiconductor layer 130. That is, the minimum thickness of the second semiconductor layer 130 is located at at least one side of the second semiconductor layer 130. In addition, the thickness of the second semiconductor layer 130 linearly decreases from the first apex 141 to the first end point 142.

Similarly, the first thickness $H_1$ is more than 0 micrometer and less than or equal to 20 micrometers, and the second thickness $H_2$ is more than 0 micrometer and less than or equal to 10 micrometers according to the present embodiment. In addition, in the present embodiment, a difference between the first thickness $H_1$ and the second thickness $H_2$ is more than 0 micrometer and less than or equal to 10 micrometers.

In addition to that, since the structures and materials of the first semiconductor layer 110 and the active layer 120 and the material of the second semiconductor layer 130 according to the present embodiment are the same as those according to the first embodiment, a description in this regard is not provided.

Figure 4B:
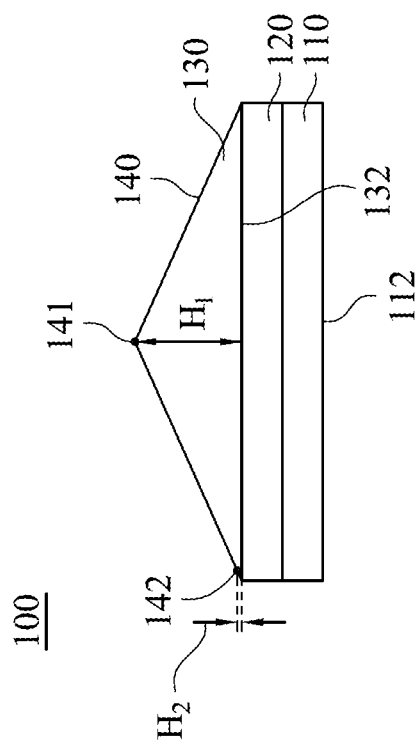
FIG. 4A and FIG. 4B respectively depict a three-dimensional schematic diagram and a cross-section view of a micro-light-emitting diode device according to a fourth embodiment of this disclosure.
Figure 4A:
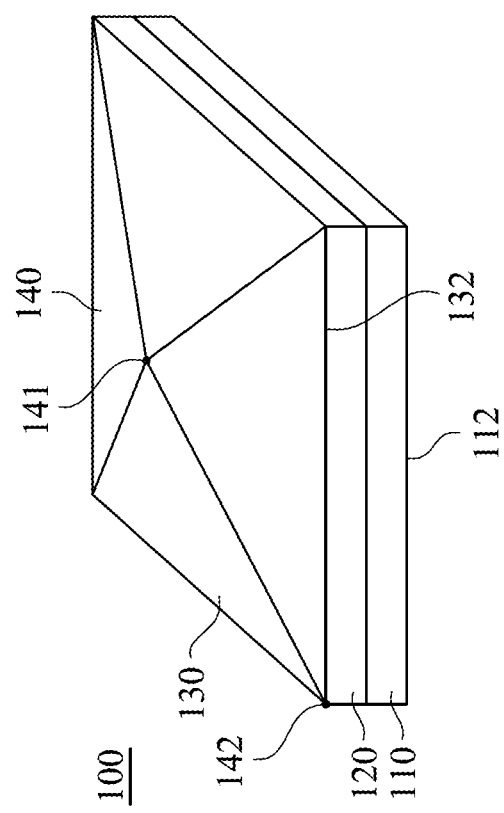

FIG. 4A and FIG. 4B respectively depict a three-dimensional schematic diagram and a cross-section view of the micro-light-emitting diode device 100 according to a fourth embodiment of this disclosure. The difference between the present embodiment and the third embodiment is that a shape of the second semiconductor layer 130 according to the present embodiment is a triangle when viewed from a side, and the second thickness $H_2$ of the second semiconductor layer 130 is approximately 0. In addition to that, since the structures and materials of the first semiconductor layer 110 and the active layer 120 and the material of the second semiconductor layer 130 according to the present embodiment are the same as those according to the third embodiment, a description in this regard is not provided. Similarly, the length of the second thickness $H_2$ and the position of the first end point 142 marked in FIG. 4B are only schematic, and their length and position are corresponding to the minimum thickness of the second semiconductor layer 130.

Figures 5A, 5B:
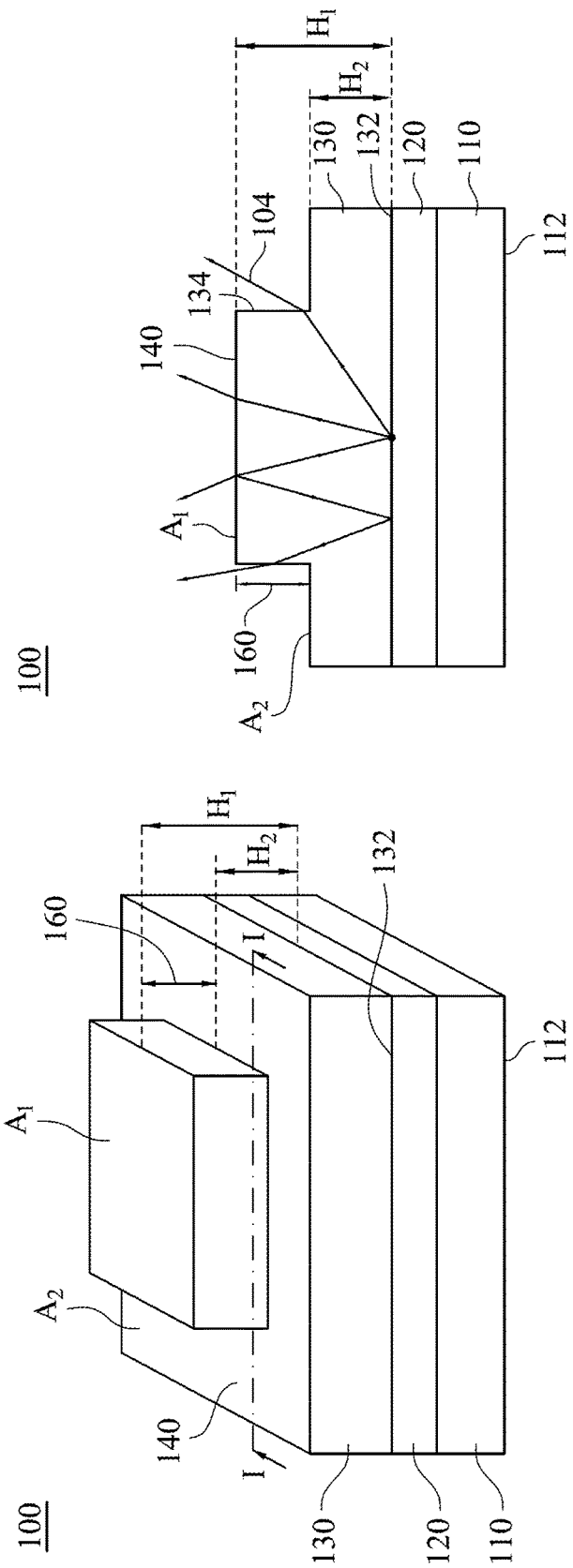
FIG. 5A and FIG. 5B respectively depict a three-dimensional schematic diagram and a cross-sectional view taken along line I-I of a micro-light-emitting diode device according to a fifth embodiment of this disclosure.

FIG. 5A and FIG. 5B respectively depict a three-dimensional schematic diagram and a side cross-sectional schematic diagram taken along line I-I of the micro-light-emitting diode device 100 according to a fifth embodiment of this disclosure. The difference between the present embodiment and the first embodiment is that a cross-sectional shape of the second semiconductor layer 130 taken along line I-I according to the present embodiment is an inverted T-shape. Hence, a cross section of the light-exiting surface 140 taken along line I-I is an inverted T-shape correspondingly.

In greater detail, the inverted T-shaped second semiconductor layer 130 has a protruding first area $A_1$ and a second area $A_2$ surrounding the first area $A_1$. The second semiconductor layer 130 has the uniform first thickness $H_1$ and the uniform second thickness $H_2$ respectively corresponding to the first area $A_1$ and the second area $A_2$. The first thickness $H_1$ is greater than the second thickness $H_2$. The second semiconductor layer 130 thus has at least one step between the first area $A_1$ and the second area $A_2$.

Similarly, the first thickness $H_1$ is more than 0 micrometer and less than or equal to 20 micrometers, and the second thickness $H_2$ is more than 0 micrometer and less than or equal to 10 micrometers. According to the present embodiment, a difference between the first thickness $H_1$ and the second thickness $H_2$ of the light-exiting surface 140 is more than 0 micrometer and less than or equal to 10 micrometers.

In addition, when light progresses from the first area $A_1$ towards the second area $A_2$ of the second semiconductor layer 130, an incident angle of part of the light on the light-exiting surface 140 corresponding to the second area $A_2$ is relatively larger than an incident angle of the light on the light-exiting surface 140 corresponding to the first area $A_1$. As a result, a probability of total reflection occurring on the light-exiting surface 140 located in the second area $A_2$ is higher than a probability of total reflection on the light-exiting surface 140 located in the first area $A_1$. In the configuration of the present embodiment, part of the light progressing from the first area $A_1$ towards the second area $A_2$ is exited from a side 134, such as a path of the light 104 shown in FIG. 5B. In other words, the inverted T-shaped light-exiting surface 140 can increase the surface area to increase the light extraction probability of the light 104. Additionally, an incident angle of the light 104 is changed because of the step 160 to reduce total reflection so as to reduce the probability that the light 104 is totally reflected inside the micro-light-emitting diode device 100.

In summary, the second semiconductor layer 130 and the light-exiting surface 140 of the micro-light-emitting diode device 100 according to the present embodiment are inverted T-shapes and the second semiconductor layer 130 has the step 160 to reduce the probability of total reflection and increase the light extraction efficiency.

In addition to that, an area of the light-exiting surface 140 corresponding to a position of the second semiconductor layer 130 having the first thickness $H_1$ occupies 65% to 85% of a total area of the light-exiting surface 140. That is, the light-exiting surface 140 located in the first area $A_1$ occupies 65% to 85% of a total area of the light-exiting surface 140. Under such a configuration, the probability of total reflection occurring inside the micro-light-emitting diode device 100 is effectively reduced to further increase the light extraction efficiency of the micro-light-emitting diode device 100.

However, those of ordinary skill in the art may flexibly select the number of the steps 160 depending on practical needs. For example, the light-exiting surface 140 is designed to be a stepped (a plurality of steps 160) surface. Additionally, since the structures and materials of the first semiconductor layer 110 and the active layer 120 and the material of the second semiconductor layer 130 according to the present embodiment are the same as those according to the first embodiment, a description in this regard is not provided.

Figure 6:
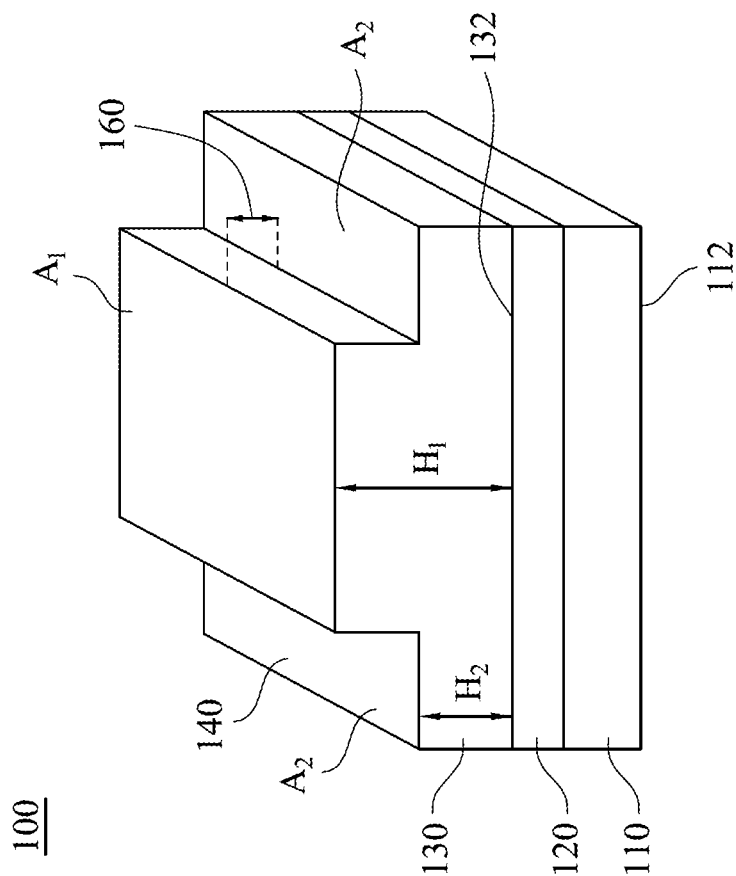
FIG. 6 depicts a three-dimensional schematic diagram of a micro-light-emitting diode device according to a sixth embodiment of this disclosure.

FIG. 6 depicts a three-dimensional schematic diagram of a micro-light-emitting diode device according to a sixth embodiment of this disclosure. The difference between the present embodiment and the fifth embodiment is that the second areas $A_2$ of the second semiconductor layer 130 according to the present embodiment are located on two opposites of the first area $A_1$. The cross section of the second semiconductor layer 130 is an inverted T-shape and the second semiconductor layer 130 has the protruding first area $A_1$. Portions located on the two opposite sides of the first area $A_1$ are the second areas $A_2$ of the second semiconductor layer 130.

Similarly, the minimum thickness of the second semiconductor layer 130 is located at least one side of the second semiconductor layer 130. The first area $A_1$ and the second areas $A_2$ of the second semiconductor layer 130 respectively have the first thickness $H_1$ and the second thickness $H_2$. The first thickness $H_1$ is greater than the second thickness $H_2$. The second semiconductor layer 130 thus has the step 160 between the first area $A_1$ and each of the second areas $A_2$. Since the configuration of the first thickness $H_1$ and the second thickness $H_2$ of the second semiconductor later 130 is the same as that of the fifth embodiment, a description in this regard is not provided. In addition, an area of the light-exiting surface 140 located in the first area A₁ similarly occupies 65% to 85% of the total area of the light-exiting surface 140.

In addition to that, since the structures of the first semiconductor layer 110 and the active layer 120 according to the present embodiment are the same as those according to the first embodiment, and the materials of the first semiconductor layer 110, the active layer 120, and the second semiconductor layer 130 are also the same as those of the first embodiment, a description in this regard is not provided.

Figure 7A:
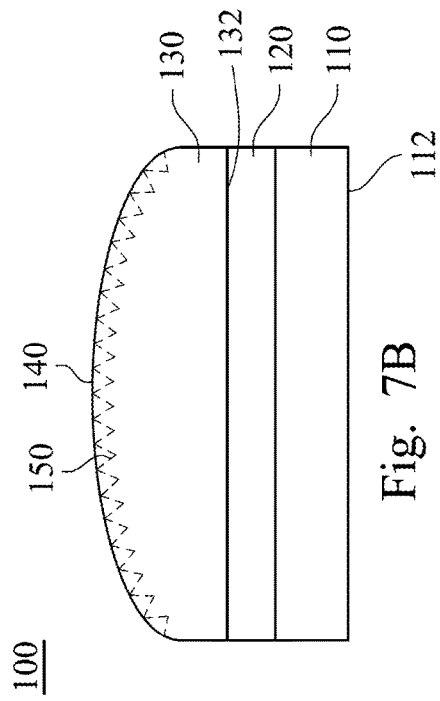
FIG. 7A to FIG. 7C depict cross-section views of a micro-light-emitting diode device respectively according to various examples of a seven embodiment of this disclosure.
Figure 7B:
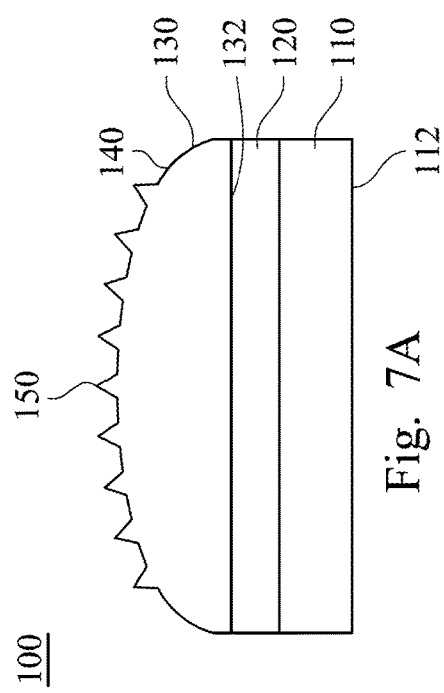
Figure 7C:
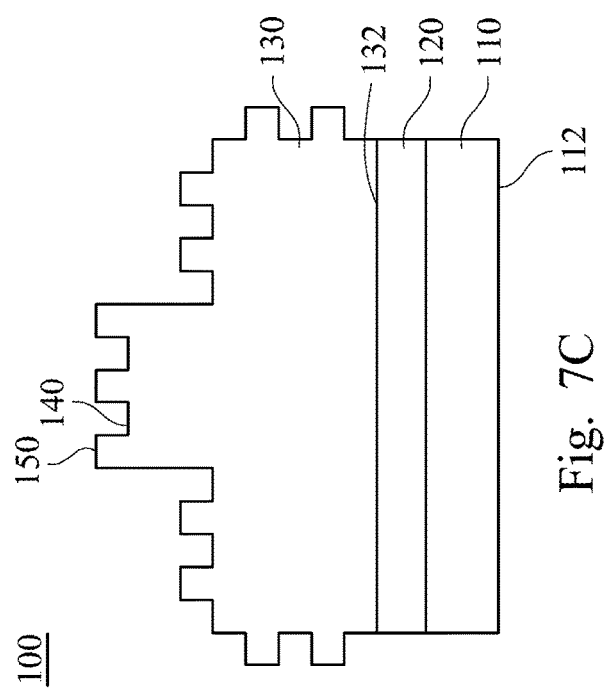

FIG. 7A to FIG. 7C depict cross-section views of the micro-light-emitting diode device 100 respectively according to various examples of a seven embodiment of this disclosure. The light-exiting surface 140 of the micro-light-emitting diode device 100 according to the present embodiment has at least one microstructure 150. In FIG. 7A and FIG. 7B, the light-exiting surfaces 140 of the micro-light-emitting diode device 100 according to the first embodiment having the microstructures 150 are taken for example. In FIG. 7C, the light-exiting surface 140 of the micro-light-emitting diode device 100 according to the fifth embodiment having the microstructure 150 is taken for example.

In the present embodiment, the microstructure 150 includes a recessed portion or a raised portion. For example, the microstructures 150 in FIG. 7A and FIG. 7C include the raised portions. The raised portions serve as protruding structures of a surface of the second semiconductor layer 130. The microstructure 150 in FIG. 7B includes the recessed portions. The recessed portions serve as recessed structures (that is, the dashed line depicted in FIG. 7B represents positions of the recessed structures that the surface of the second semiconductor layer 130 has) of the surface of the second semiconductor layer 130. By utilizing the microstructure 150, an incident angle of light emitted from the active layer 120 to the light-exiting surface 140, and incident angle of light on the light-exiting surface 140 is changed again to reduce the probability that the light is totally reflected inside the micro-light-emitting diode device 100 the second time. As a result, the light extraction efficiency of the micro-light-emitting diode device 100 is increased.

In addition to that, since the structures and materials of the first semiconductor layer 110, the active layer 120, and the second semiconductor layer 130 according to the present embodiment are the same as those of the embodiments corresponding to the present embodiment, a description in this regard is not provided.

Figure 8B:
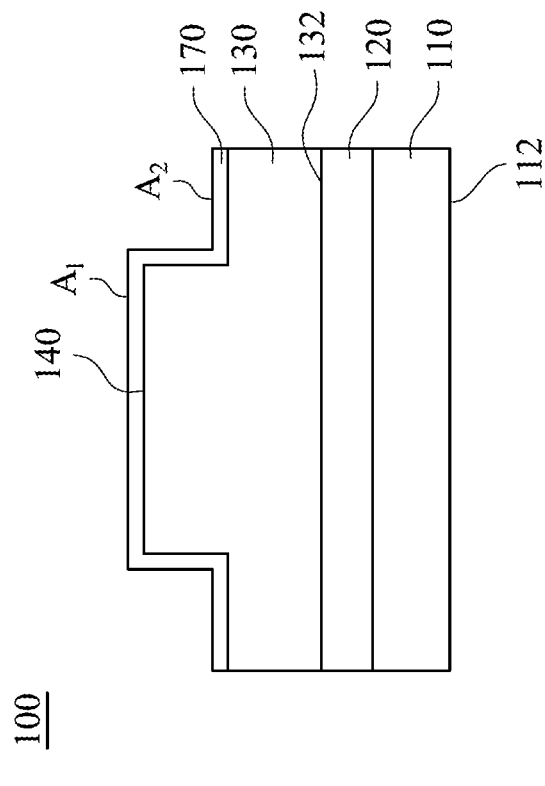
FIG. 8A and FIG. 8B depict cross-section views of a micro-light-emitting diode device respectively according to various examples of an eight embodiment of this disclosure.
Figure 8A:
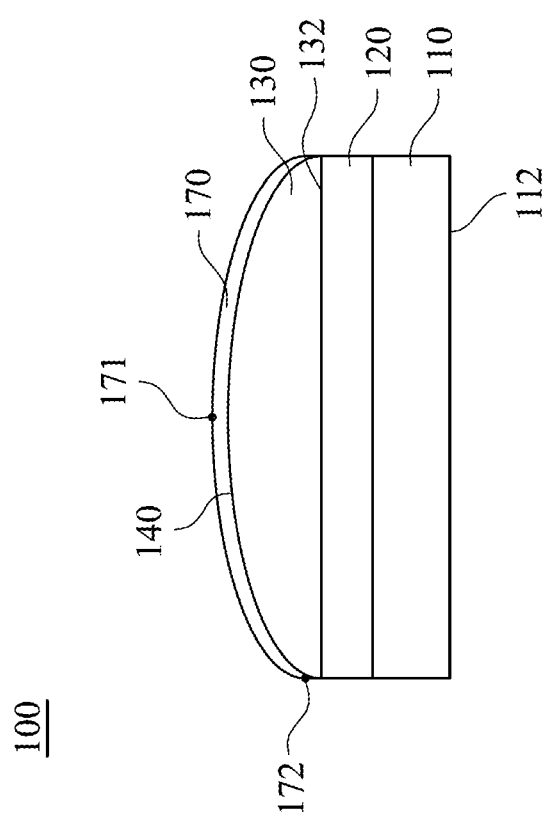

FIG. 8A and FIG. 8B depict cross-section views of the micro-light-emitting diode device 100 respectively according to various examples of an eight embodiment of this disclosure. The micro-light-emitting diode device 100 according to the present embodiment further includes an electrode layer 170. In FIG. 8A, the electrode layer 170 being disposed on the micro-light-emitting diode device 100 according to the first embodiment is taken for example. In FIG. 8B, the electrode layer 170 being disposed on the micro-light-emitting diode device 100 according to the fifth embodiment is taken for example.

In the present embodiment, the electrode layer 170 is disposed on the second semiconductor layer 130. The electrode layer 170 has a uniform thickness, and a shape of the electrode layer 170 corresponds to the shape of the light-exiting surface 140. For example, the electrode layers 170 in FIG. 8A and FIG. 8B are respectively in a spherical shape and in an inverted-T shape. Since the shape of the electrode layer 170 corresponds to the shape of the light-exiting surface 140, the probability that light is totally reflected inside the micro-light-emitting diode device 100 still can be maintained relatively low.

A material of the electrode layer 170 is a transparent electrode material, such as indium-gallium-zinc oxide (IGZO), indium-tin oxide (ITO), indium-zinc oxide (IZO), zinc-tin oxide (ZTO), gallium-zinc oxide (GZO), or other suitable materials, or combinations thereof.

In addition to that, since the structures and materials of the first semiconductor layer 110, the active layer 120, and the second semiconductor layer 130 according to the present embodiment are the same as those of the embodiments corresponding to the present embodiment, a description in this regard is not provided.

Figure 9A:
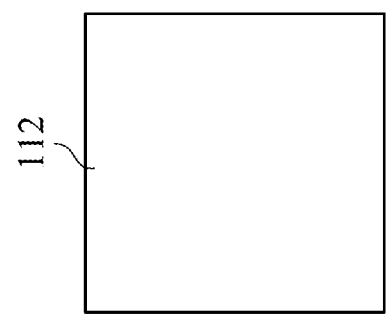
FIG. 9A to FIG. 9D depict bottom schematic diagrams of a micro-light-emitting diode device respectively according to various examples of a ninth embodiment of this disclosure.
Figure 9B:
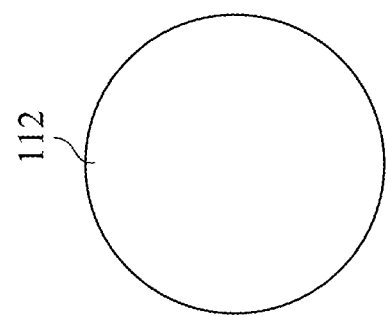
Figure 9C:
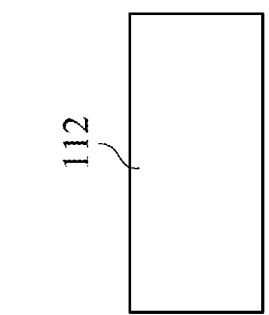
Figure 9D:
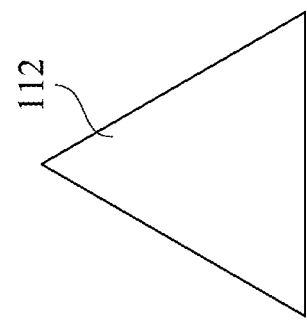

FIG. 9A to FIG. 9D depict bottom schematic diagrams of the micro-light-emitting diode device 100 respectively according to various examples of a ninth embodiment of this disclosure. As shown in FIG. 9A, the shape of the micro-light-emitting diode device 100 may be a rectangle when viewed from the first bottom surface 112. As shown in FIG. 9B, the shape of the micro-light-emitting diode device 100 may be a circle when viewed from the first bottom surface 112. Various polygonal shapes should be within the scope of present embodiment. As shown in FIG. 9C, the shape of the micro-light-emitting diode device 100 may be a rectangle when viewed from the first bottom surface 112. As shown in FIG. 9D, the shape of the micro-light-emitting diode device 100 may be a triangle when viewed from the first bottom surface 112.

FIG. 10A to FIG. 10L depict schematic diagrams of a method for manufacturing a micro-light-emitting diode device respectively at different stages according to a first embodiment of this disclosure. In the present embodiment, the method for manufacturing the micro-light-emitting diode device is illustrated by taking the structure of the micro-light-emitting diode device according to the first embodiment (see FIG. 1A) as an example. In addition, FIG. 10A to FIG. 10H are cross-section views, and FIG. 10I to FIG. 10L are three-dimensional schematic diagrams.

Figure 10A:
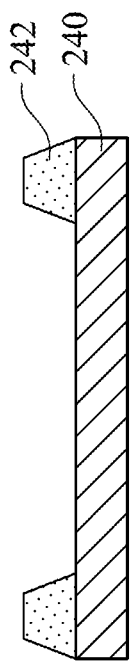

As shown in FIG. 10A, in step S10, a first substrate 240 is provided and a mask layer 242 is formed on the first substrate 240. The mask layer 242 is formed on the first substrate 240 by deposition. According to the present embodiment, the mask layer 242 may be regarded as a hard mask used in an etching process. The mask layer 242 may be made of silicon oxide or silicon nitride.

In addition, selection of material of the first substrate 240 is varied with color light provided by the micro-light-emitting diode device. For example, when a micro-light-emitting diode device providing red light is formed, the first substrate 240 may be made of gallium arsenide (GaAs), gallium phosphide (GaP), indium phosphide (InP), or silicon (Si), or other suitable materials. When a micro-light-emitting diode device providing blue or green light is formed, the first substrate 240 may be made of sapphire, gallium nitride (GaN), or silicon carbide (SiC), or other suitable materials. In addition, a thickness of the first substrate 240 made of sapphire is between 50 micrometers and 1000 micrometers.

Figure 10B:
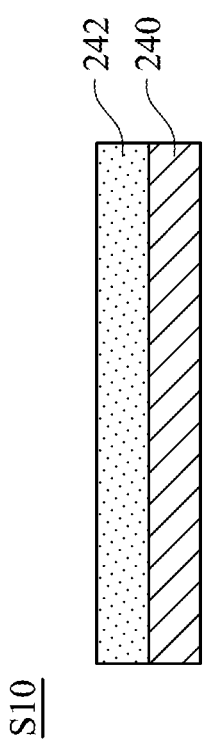

As shown in FIG. 10B, in step S20, the mask layer 242 is patterned to expose a portion of the first substrate 240. The patterned mask layer 242 and the exposed first substrate 240 can be used for defining a size of the micro-light-emitting diode device.

Figure 10C:
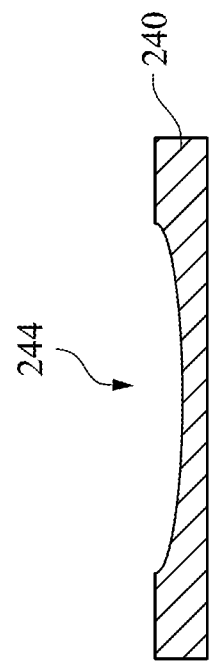

As shown in FIG. 10C, in step S30, the portion of the first substrate 240 are etched to form a recess 244. The first substrate 240 has a first shape corresponding to the recess 244. The portions of the first substrate 240 may be etched by, for example, photolithography and etching.

A description is provided with reference to FIG. 1A, FIG. 1B, and FIG. 10C. The recess 244 is used for depositing the second semiconductor layer 130 of the micro-light-emitting diode device 100. The second semiconductor layer 130 has the light-exiting surface 140, and the light-exiting surface 140 has a second shape. The first shape of the first substrate 240 is the same as the second shape of the light-exiting surface 140. In greater detail, the shape of the light-exiting surface 140 is the same as a shape of the recess 244 of the first substrate 240. For example, the shape of the light-exiting surface 140 and the shape of the recess 244 of the first substrate 240 are both spheres.

Additionally, the recess 244 has a first depth $D_1$ and a second depth $D_2$ corresponding to the light-exiting surface 140. The first depth $D_1$ is greater than the second depth $D_2$. The first depth $D_1$ is a depth at a center of the recess 244, and the first depth $D_1$ is a maximum among depths of the recess 244. The second depth $D_2$ is an initial depth of the recess 244 corresponding to an edge. That is, the second depth $D_2$ is a minimum among the depths of the recess 244.

Figure 10D:
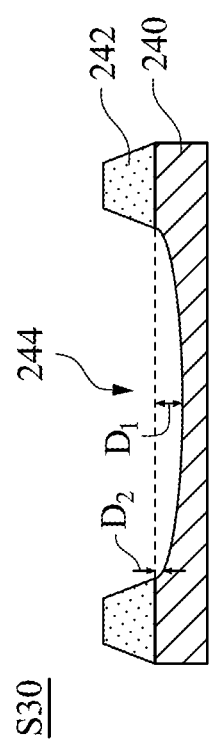

As shown in FIG. 10D, in step S40, the mask layer 242 (see FIG. 10C) is removed and the first substrate 240 having the recess 244 is left. The mask layer 242 is removed by etching according to the present embodiment.

Figure 10E:
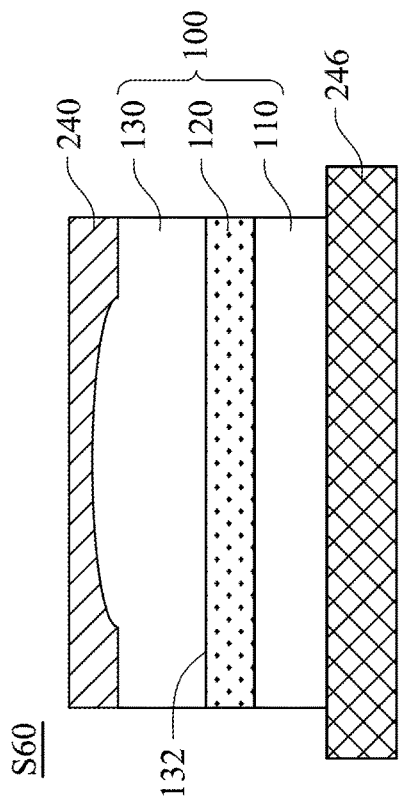

As shown in FIG. 10E, in step S50, the second semiconductor layer 130 is first deposited on the recess 244 of the first substrate 240. A surface of the second semiconductor layer 130 contacting the recess 244 forms the second shape, and the second shape is the same as the first shape of the first substrate 240.

Then, metal organic chemical-vapor deposition (MOCVD) is utilized to deposit the active layer 120 and the first semiconductor layer 110 in sequence. The active layer 120 is deposited on the second semiconductor layer 130. The first semiconductor layer 110 is deposited on the active layer 120 to complete formation of the micro-light-emitting diode device 100 on the first substrate 240.

In the present embodiment, the micro-light-emitting diode device 100 includes the first semiconductor layer 110, the active layer 120, and the second semiconductor layer 130. Since the thicknesses and materials of the first semiconductor layer 110, the active layer 120, and the second semiconductor layer 130 are the same as those of the micro-light-emitting diode device 100 according to the first embodiment, a description in this regard is not provided.

Figure 10F:
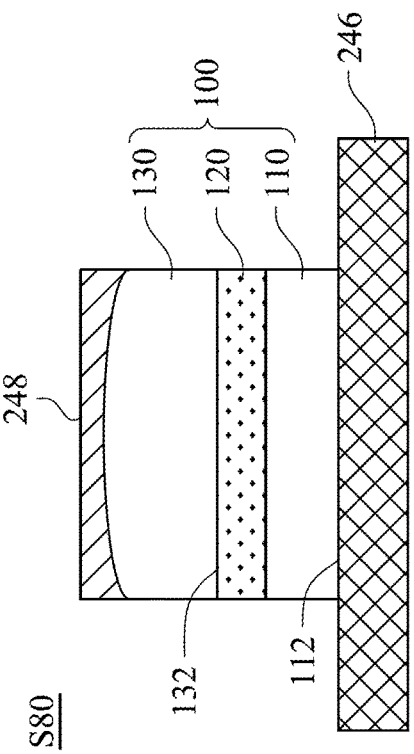

As shown in FIG. 10F, in step S60, the first substrate 240 and the micro-light-emitting diode device 100 are transferred and reversed to a second substrate 246. The first semiconductor layer 110 of the micro-light-emitting diode device 100 is connected to the second substrate 246. That is, the micro-light-emitting diode device 100 is located between the first substrate 240 and the second substrate 246. Additionally, the second substrate 246 may be a glass substrate, a plastic substrate, or a flexible substrate.

Figure 10G:
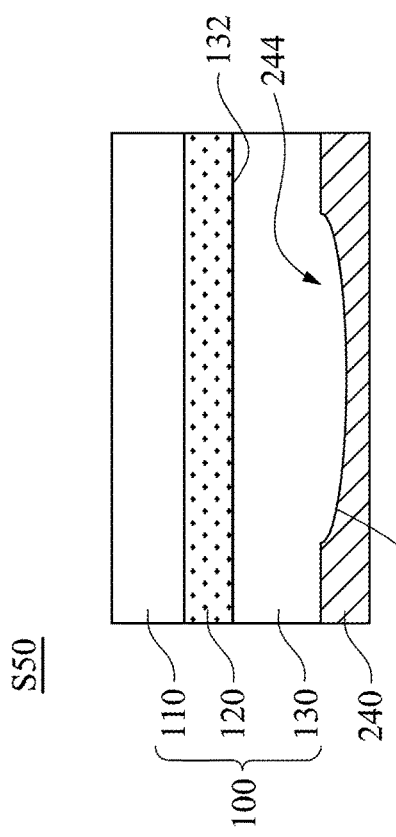

As shown in FIG. 10G, in step S70, the first substrate 240 is removed to allow the first substrate 240 (see FIG. 10F) to be separated from the micro-light-emitting diode device 100. In addition to that, the step of removing the first substrate 240 may be performed by the laser lift-off technology. After the first substrate 240 is removed 240, the light-exiting surface 140 of the second semiconductor layer 130 is exposed to complete the structure of the micro-light-emitting diode device 100.

Figure 10H:
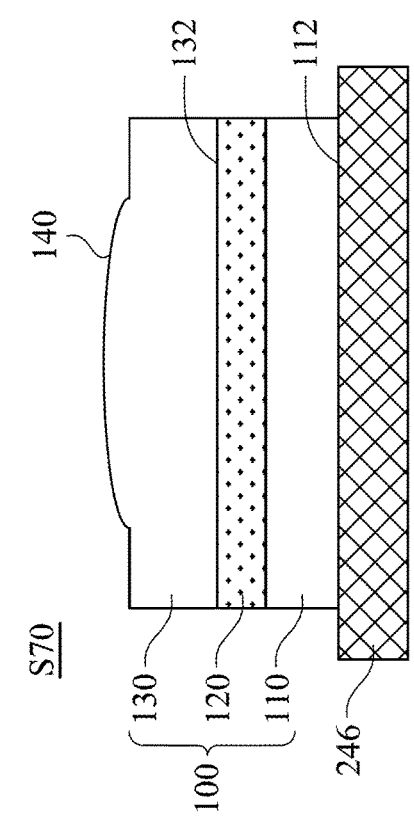

As shown in FIG. 10H, in step S80, the size of the micro-light-emitting diode device 100 is further defined.

According to the present embodiment, the size of the micro-light-emitting diode device 100 may be defined by etching. Etching first semiconductor layer 110 active layer 120 and second semiconductor layer 130 in the same time to define a size of a micro-light-emitting diode device. For example, a photoresist layer 248 is coated and a lithography process is utilized to define the size of the micro-light-emitting diode device 100. After defining the size of the micro-light-emitting diode device 100, the photoresist layer 248 is removed. Vertical-projection zones of the first semiconductor layer 110, the active layer 120, and the second semiconductor layer 130 thus etched on the first bottom surface 112 of the first semiconductor layer 110 are substantially the same.

Figure 10J:
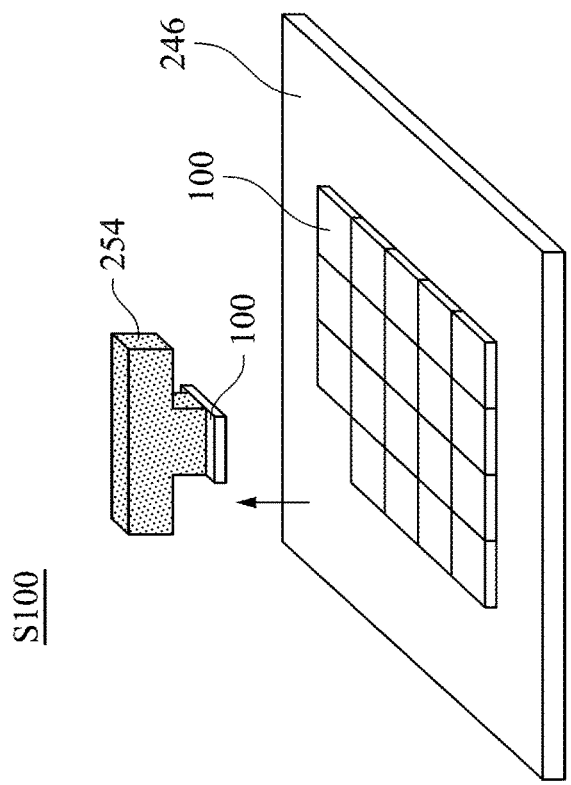
Figure 10I:
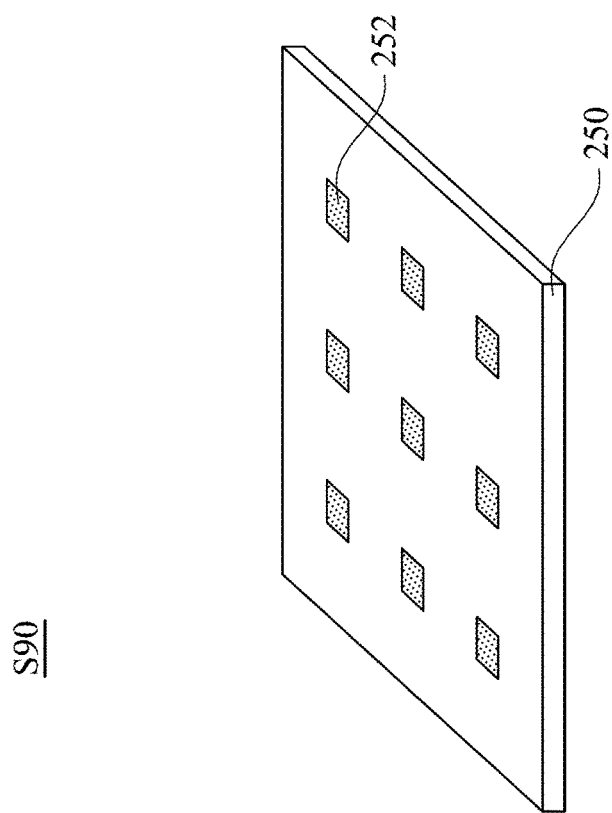

As shown in FIG. 10I, in step S90, a panel 250 comprises a plurality of pixels (not show in figure). Each of the plurality of pixels is provided at least one thin film transistor 252. The thin film transistor 252 is used for connecting to the corresponding micro-light-emitting diode device 100 thus manufactured the panel 250. (see FIGS. 10I to 10L). However, those of ordinary skill in the art may flexibly arrange the thin film transistors 252 and the micro-light-emitting diode device 100 relationship.

As shown in FIG. 10J, in step S100, the micro-light-emitting diode device 100 thus manufactured is gripped to allow the micro-light-emitting diode device 100 to be separated from the second substrate 246 along the arrow direction. According to the present embodiment, the step of separating the micro-light-emitting diode device 100 from the second substrate 246 is performed by a transposition means 254.

As shown in FIG. 10K, in step S110, the micro-light-emitting diode device 100 is moved onto the thin film transistor 252 on the panel 250 by the transposition means 254 to allow the micro-light-emitting diode devices 100 to be combined with the thin film transistor 252 on the panel 250. According to the present embodiment, a pixel configuration of the pixel 250 can be completed by performing step S110 repeatedly.

Then, a description is provided with reference to FIG. 10L. As shown in FIG. 10L, in step S120, the electrode layers 170 are disposed on the second semiconductor layers 130 of the micro-light-emitting diode devices 100 to complete a display panel utilizing the micro-light-emitting diode device 100.

Although the structure of the micro-light-emitting diode device 100 according to the first embodiment being manufactured in FIG. 10A to FIG. 10L is taken for example, those of ordinary skill in the art may etch the substrate 240 into different first shapes by photolithography to allow the first shape of the first substrate 240 to correspond to the light-exiting surface 140 in different shapes.

Figure 11B:
FIG. 11A and FIG. 11B depict cross-section views of the first substrate in FIG. 10C respectively according to various embodiments.
Figure 11A:
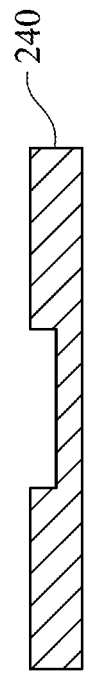

For example, a description is provided with reference to FIG. 11A and FIG. 11B. FIG. 11A and FIG. 11B depict cross-section views of the first substrate 240 in FIG. 10C respectively according to various embodiments. In FIG. 11A, the first substrate 240 can be etched into the first shape that is an inverted triangle so as to correspond to the shapes of the light-exiting surfaces 140 of the micro-light-emitting diode devices 100 in the third embodiment and the fourth embodiment. In FIG. 11B, the first substrate 240 can be etched into the first shape that has a step so as to correspond to the shapes of the light-exiting surfaces 140 of the micro-light-emitting diode devices 100 in the fifth embodiment and the sixth embodiment.

FIG. 12A to FIG. 12D depict cross-section views of a method for manufacturing a micro-light-emitting diode device respectively at different stages according to a second embodiment of this disclosure. The difference between the present embodiment and the previous embodiment is that the second semiconductor layer 130 according to the present embodiment fills and levels up the recess 244 by deposition. That is, the second semiconductor layer 130 fills up only in the recess 244 and the second semiconductor layer 130 does not overflow the recess 244. In addition to that, a structure of the micro-light-emitting diode device 100 formed according to the present embodiment is the same as that of the micro-light-emitting diode device according to the second embodiment (see FIG. 2).

Figure 12A:
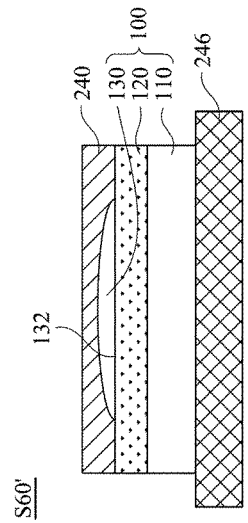
FIG. 12A to FIG. 12D depict cross-section views of a method for manufacturing a micro-light-emitting diode device respectively at different steps according to a second embodiment of this disclosure.

First, a description is provided with reference to FIG. 12A. FIG. 12A depicts a process following FIG. 10D. As shown in FIG. 12A, in step S50', the second semiconductor layer 130 is only deposited in the recess 244. That is, the second bottom surface 132 of the second semiconductor layer 130 and a top surface of the first substrate 240 are coplanar. Similarly, the active layer 120 is deposited on the second semiconductor layer 130. The first semiconductor layer 110 is deposited on the active layer 120 to complete the formation of the micro-light-emitting diode device 100 on the first substrate 240.

Figure 12B:
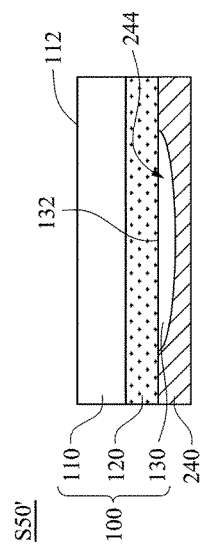

As shown in FIG. 12B, in step S60', the first substrate 240 and the micro-light-emitting diode device 100 are transferred to a second substrate 246. The micro-light-emitting diode device 100 is located between the first substrate 240 and the second substrate 246.

Figure 12C:
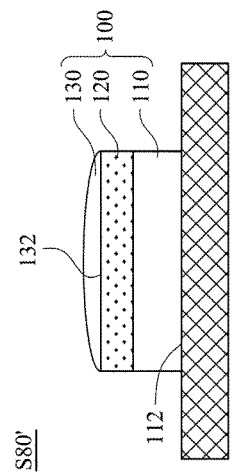

As shown in FIG. 12C, in step S70', the first substrate 240 can be removed by a manufacturer at this time to expose the light-exiting surface 140 and part of the active layer 120 of the micro-light-emitting diode device 100.

Figure 12D:
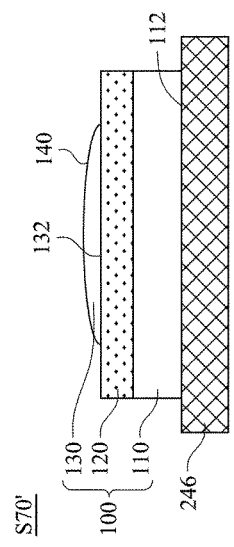

As shown in FIG. 12D, in step S80', the size of the micro-light-emitting diode device 100 is further defined by etching. According to the present embodiment, the part of the active layer 120 that is exposed and part of the first semiconductor layer 110 underneath the part of the active layer 120 that is exposed are removed by etching. Hence, vertical-projection zones of the first semiconductor layer 110 and the active layer 120 thus etched and the second semiconductor layer 130 on the first bottom surface 112 of the first semiconductor layer 110 are substantially the same.

In summary, since the second semiconductor layer of the micro-light-emitting diode device of the present disclosure has a greater thickness at the center than at the edge, the cross section of the light-exiting surface has a more protruding center. Therefore, the probability that the light is totally reflected inside the micro-light-emitting diode device is reduced to increase the light extraction efficiency of the micro-light-emitting diode.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of the present disclosure provided they fall within the scope of the following claims.

What is claimed is:

1. A method for manufacturing a micro-light-emitting diode device comprising:
    providing a first substrate;
    depositing a mask layer on the first substrate;
    patterning the mask layer to expose a portion of the first substrate;
    etching the exposed portion of the first substrate to form a recess, and a depth at a center of the recess being greater than a depth at an edge of the recess;
    removing the mask layer;
    forming a micro-light-emitting diode device comprising:
    depositing a second semiconductor layer on the recess;
    depositing an active layer on the second semiconductor layer, wherein the recess is filled with a portion of the second semiconductor layer; and
    depositing a first semiconductor layer on the active layer;
    transferring and reversing the first substrate and the micro-light-emitting diode device to a second substrate, the first semiconductor layer of the micro-light-emitting diode device being connected to the second substrate;
    etching the first semiconductor layer, the active layer and the second semiconductor layer in a same time to define a size of the micro-light-emitting diode device; and
    removing the first substrate.

2. The method of claim 1, wherein the second semiconductor layer is deposited in the recess and fills and levels up the recess.

3. The method of claim 1, wherein the portion of the first substrate is etched to form a first shape, and the second semiconductor layer is deposited on the recess to form a light-exiting surface, the light-exiting surface has a second shape, and the first shape and the second shape are the same.

4. The method of claim 1, further comprising:
    providing a panel, and forming at least one thin film transistor on the panel;
    gripping the micro-light-emitting diode device to allow the micro-light-emitting diode device to be separated from the second substrate, and moving the micro-light-emitting diode device onto the thin film transistor; and
    forming an electrode layer on the second semiconductor layer of the micro-light-emitting diode device.

* * * * *